(12) United States Patent
Yang et al.

(10) Patent No.: US 8,288,276 B2
(45) Date of Patent: Oct. 16, 2012

(54) METHOD OF FORMING AN INTERCONNECT STRUCTURE INCLUDING A METALLIC INTERFACIAL LAYER LOCATED AT A BOTTOM VIA PORTION

(75) Inventors: Chih-Chao Yang, Poughkeepsie, NY (US); Veeraraghavan S. Basker, Albany, NY (US); William Tonti, Essex Junction, VT (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 228 days.

(21) Appl. No.: 12/346,040

(22) Filed: Dec. 30, 2008

(65) Prior Publication Data
US 2010/0164111 A1 Jul. 1, 2010

(51) Int. Cl.
*H01L 21/44* (2006.01)
(52) U.S. Cl. ......... 438/660; 257/E21.591; 257/E21.584; 438/627; 438/643; 438/637
(58) Field of Classification Search .................. 438/627, 438/637, 643, 660; 257/E21.591, E21.584
See application file for complete search history.

(56) References Cited

U.S. PATENT DOCUMENTS

| | | | |
|---|---|---|---|
| 5,098,860 A | 3/1992 | Chakravorty et al. | |
| 5,930,669 A | 7/1999 | Uzoh | |
| 5,933,753 A | 8/1999 | Simon et al. | |
| 6,274,499 B1 * | 8/2001 | Gupta et al. | 438/692 |
| 6,383,920 B1 | 5/2002 | Wang et al. | |
| 6,429,519 B1 | 8/2002 | Uzoh | |
| 6,444,567 B1 * | 9/2002 | Besser et al. | 438/625 |
| 6,486,478 B1 * | 11/2002 | Libby et al. | 250/492.1 |
| 6,924,234 B2 * | 8/2005 | Han et al. | 438/687 |
| 6,967,155 B2 * | 11/2005 | Lin et al. | 438/622 |
| 7,045,455 B2 | 5/2006 | Zhang et al. | |
| 7,084,062 B1 | 8/2006 | Avanzino et al. | |
| 7,317,253 B2 | 1/2008 | Nogami | |
| 7,534,712 B2 * | 5/2009 | Takami | 438/597 |
| 2004/0121583 A1 | 6/2004 | Bao et al. | |
| 2004/0211357 A1 | 10/2004 | Gadgil et al. | |
| 2006/0027930 A1 * | 2/2006 | Edelstein et al. | 257/762 |
| 2006/0286800 A1 | 12/2006 | Dominguez et al. | |
| 2009/0072406 A1 * | 3/2009 | Yang et al. | 257/761 |

OTHER PUBLICATIONS

U.S. Appl. No. 11/856,970, entitled "Interconnect Structure With Improved Electromigration Resistance and Method of Fabricating Same," First Named Inventor: Chih-Chao Yang, filed Sep. 18, 2007.

* cited by examiner

*Primary Examiner* — Howard Weiss
(74) *Attorney, Agent, or Firm* — Scully, Scott, Murphy & Presser, P.C.; Richard M. Kotulak, Esq.

(57) ABSTRACT

Interconnect structures having improved electromigration resistance are provided that include a metallic interfacial layer (or metal alloy layer) that is present at the bottom of a via opening. The via opening is located within a second dielectric material that is located atop a first dielectric material that includes a first conductive material embedded therein. The metallic interfacial layer (or metal alloy layer) that is present at the bottom of the via opening is located between the underlying first conductive material embedded within the first dielectric and the second conductive material that is embedded within the second dielectric material. Methods of fabricating the improved electromigration resistance interconnect structures are also provided.

16 Claims, 6 Drawing Sheets

US 8,288,276 B2

METHOD OF FORMING AN INTERCONNECT STRUCTURE INCLUDING A METALLIC INTERFACIAL LAYER LOCATED AT A BOTTOM VIA PORTION

RELATED APPLICATIONS

This application is related to co-pending and co-assigned U.S. application Ser. No. 11/856,970, filed Sep. 18, 2007.

FIELD OF THE INVENTION

The present invention relates to a semiconductor interconnect structure, and a method of fabricating the same. More particularly, the present invention relates to a semiconductor interconnect structure having improved electromigration (EM) resistance and to a method of fabricating such an interconnect structure.

BACKGROUND OF THE INVENTION

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multilevel (i.e., multilayered) schemes, such as, for example, single or dual damascene wiring structures. The wiring structure typically, but not necessarily always, includes copper (Cu) since Cu-based interconnect wiring structures provide higher speed signal transmission between large numbers of transistors on a complex semiconductor chip as compared with aluminum (Al)-based interconnect structures.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's interconnect structures by embedding the metal lines and metal vias (e.g., conductive features) in a dielectric material having a dielectric constant of less than 4.0.

In semiconductor interconnect structures, electromigration (EM) has been identified as one metal failure mechanism. Electromigration is the transport of material caused by the gradual movement of the ions in a conductor due to the momentum transfer between conducting electrons and diffusing metal atoms. The effect is important in applications where high direct current densities are used, such as in microelectronics and related structures. As the structure size decreases, the practical significance of EM increases.

Electromigration is one of the worst reliability concerns for very large scale integration (VLSI) circuits. The problem not only needs to be overcome during the process development period in order to qualify the process, but it persists throughout the lifetime of the chip. Voids are created inside the metal conductor of an interconnect structure edge due to the metal movement that is caused by the high density of current flow. Interconnect structures having electromigration resistance are thus highly desirable.

Reference is made to FIG. 1 which illustrates a prior art interconnect structure having a flat via bottom. Specifically, the prior art interconnect structure includes a first dielectric material 10 which includes a conductive material 18, e.g., Cu, embedded therein. The conductive material 18 is spaced apart from the first dielectric material 10 by a bilayer diffusion barrier liner that includes a lower layer 14 of a metallic nitride, e.g., TaN, and an upper layer 16 of a metal such as, for example, Ta. The bilayer diffusion barrier liner lines an opening that was formed into the first dielectric material 10 prior to filling the same with conductive material 18.

Atop the first dielectric material 10 is a second dielectric material 10' that includes a conductive material 18' that is embedded therein. The conductive material 18' is located within a line opening 20 and via opening 22 that are formed into the second dielectric material 10'. The conductive material 18' is spaced apart from the second dielectric material 10' by another bilayer diffusion barrier layer that includes a lower layer 14' of a metallic nitride, e.g., TaN, and an upper layer 16' of a metal such as, for example, Ta. A dielectric capping layer 24 is located between the first and second dielectric layers and a portion of the dielectric capping layer 24 extends upon an upper surface of the conductive material 18 that is present in the first dielectric material 10.

The prior art structure shown in FIG. 1 has a flat via bottom (designated by A in the drawing) that is contact with the conductive material 18 within the first dielectric material 10. The prior art interconnect structure shown in FIG. 1 has a high degree of EM associated therewith due to the limited contact area between the via opening 22 and underlying interconnect 18. The limited contact area usually results in current crowding and is the weakest site for void nucleation due to the EM effect.

FIG. 2 shows another prior art interconnect structure which is basically the same as that shown in FIG. 1 except that this prior art interconnect structure includes a via gouging feature (designed by B in FIG. 2). The presence of the via gouging feature B in the interconnect structure, which increases the via contact area, improves electromigration resistance of such an interconnect structure as compared with the interconnect shown in FIG. 1.

Despite improving the electromigration resistance of the interconnect structure, the via gouging feature B shown in FIG. 2 is formed by processes that always result in profile damage. By "profile damage" it is meant patterned dielectric damage, specifically at the bottom of the line opening (i.e., the horizontal surface of the second dielectric material 10' that is exposed during the formation of the line opening), from a physical gaseous bombardment, which is used to create the via gouging feature.

In view of the above, there is need for providing interconnect structures in which the electromigration resistance is improved without introducing a gouging feature within the interconnect structure.

SUMMARY OF THE INVENTION

The present invention provides interconnect structures in which the electromigration resistance thereof is improved without introducing a gouging feature within the interconnect structure.

In the invention, an interfacial layer comprising either a metallic interfacial layer or a metal alloy interfacial layer which is the reaction product of the metallic interfacial layer and an underlying conductive material is provided at the bottom via portion of an opening formed into a second dielectric material that overlies a first dielectric material. In some embodiments, a metallic interfacial layer can also been located on a horizontal portion of a line opening that is formed into the second dielectric material. This metallic interfacial layer separates the second dielectric material from the conductive material that is embedded therein.

It is observed that the interconnect structures of the invention do not exhibit any reduction in the volume of the conductive material that is embedded within the first dielectric material. Moreover, the inventive interconnect structure has a controlled electromigration resistance in the line/via interface for both standard wiring use and for e-fuse use.

In one embodiment of the invention, the interconnect structure includes a metallic interfacial layer that is present on all horizontal surfaces of an opening formed into a dielectric material, particularly, at the bottom of a via and at the bottom of a line, located within a second dielectric material that is located atop a first dielectric material which includes a first conductive material embedded therein. The metallic interfacial layer that is present at the bottom of the via is located between the underlying first conductive material embedded within the first dielectric material and the second conductive material that is embedded within the second dielectric material. In some embodiments of the present invention, the metallic interfacial layer is processed to form a metal alloy interfacial layer. The metal alloy interfacial layer is a reaction product of the metallic interfacial layer and the first conductive material. Some examples of metal alloy interfacial layers that can be formed in the present invention are Ta—Cu, Ru—Cu, Co—Cu or Ir—Cu.

Atop the metallic interfacial layer (or metal alloy interfacial layer, if formed) there is present a diffusion barrier liner. In some embodiments, the diffusion barrier liner includes a lower layer of a metallic nitride and an upper layer of a metal.

In particular, the interconnect structure of a first embodiment of the invention includes:
a first dielectric material having a first conductive material embedded therein;
a second dielectric material located atop the first dielectric material, said second dielectric material includes at least one conductively filled opening comprising a combined via and line that is located above said first conductive material; and
an interfacial layer located only at a bottom portion of said via and at a bottom horizontal portion of said line, wherein said interfacial layer present at the bottom portion of the via separates the first conductive material embedded within the first dielectric material from said at least one conductively filled opening within the second dielectric material, said interfacial layer located within the bottom portion of said via comprises at least one of a metallic interfacial layer and a metal alloy interfacial layer, and said interfacial layer located within the bottom horizontal portion of said line is a metallic interfacial layer.

The metallic interfacial layer employed in the present invention includes any conductive metal including metals from Group VB or VIII of the Periodic Table of Elements. Examples of Group VB metals that are conductive include V, Nb and Ta. Examples of Group VIII metals that are conductive include Fe, Co, Ni, Ru, Rh, Pd, Os, Ir and Pt. In a preferred embodiment of the present invention, the metallic interfacial layer comprises Ta, Ru, Ir or Co. In some embodiments of the present invention, the metallic interfacial layer comprises In.

The metal alloy interfacial layer is a reaction product of the metallic interfacial layer and the first conductive material. Examples of metal alloy interfacial layer that can be formed in the present invention are Ta—Cu, Ru—Cu, Co—Cu or Ir—Cu.

In another embodiment of the invention, the interconnect structure includes a metal alloy interfacial layer, which is comprised of a reaction product between a subsequently formed metallic interfacial layer and an underlying conductive material, present only at the bottom of a via atop remaining portions of the underling conductive material.

In particular, the interconnect structure of the second embodiment of the invention includes:
a first dielectric material having a first conductive material embedded therein; and
a second dielectric material located atop the first dielectric material, said second dielectric material includes at least one conductively filled opening that is located above said first conductive material, wherein said at least one conductively filled opening and said first conductive material are horizontally separated by a metal alloy interfacial layer that is present only within a bottom portion of said at least one conductively filled opening, said metal alloy interfacial layer comprising a reaction product of a metallic interfacial layer and the first conductive material.

Some examples of metal alloy interfacial layers that can be formed in the present invention are Ta—Cu, Ru—Cu, Co—Cu or Ir—Cu.

In addition to providing interconnect structures having improved electromigration resistance, the present invention also provides methods of fabricating the same.

In one embodiment of the invention, the method of the present invention includes:
providing a structure including a first dielectric material having a first conductive material embedded therein and a second dielectric material located above said first dielectric material, said second dielectric material having a combined via and line opening which exposes a surface of said first conductive material;
forming a metallic interfacial layer on said exposed surface of said first conductive material and along a horizontal wall portion of said line;
forming a diffusion barrier liner within said combined via and line opening; and
forming a second conductive material on said diffusion barrier liner, said second conductive material having an upper surface that is coplanar with an upper surface of said second dielectric.

The metallic interfacial layer employed in the present invention includes any conductive metal including metals from Group VB or VIII of the Periodic Table of Elements. Examples of Group VB metals that are conductive include V, Nb and Ta. Examples of Group VIII metals that are conductive include Fe, Co, Ni, Ru, Rh, Pd, Os, Ir and Pt. In a preferred embodiment of the present invention, the metallic interfacial layer comprises Ta, Ru, Ir or Co. In some embodiments of the present invention, the metallic interfacial layer comprises In.

In some embodiments of the invention, an annealing step is performed which causes a reaction between the metallic interfacial layer and the underlying first conductive material that results in the formation of a metal alloy interfacial layer. In some embodiments, the metal alloy interfacial layer replaces all of the metallic interfacial layer, while in other embodiments the metal alloy interfacial layer replaces a part of the metallic interfacial layer and is present between the metallic interfacial layer and the first conductive material.

In another embodiment of the invention, the method of the present invention includes:
providing a structure including a first dielectric material having a first conductive material embedded therein and a second dielectric material located above said first dielectric material, said second dielectric material having a combined via and line opening which exposes a surface of said first conductive material;
forming a metallic interfacial layer only on said exposed surface of said first conductive material;

converting at least a portion of said metallic interfacial layer into a metal alloy interfacial layer, said converting includes annealing;

forming a diffusion barrier liner within said combined via and line opening; and forming a second conductive material on said diffusion barrier liner, said second conductive material having an upper surface that is coplanar with an upper surface of said second dielectric.

DETAILED DESCRIPTION OF THE INVENTION

The present invention, which provides interconnect structures having improved electromigration (EM) resistance without including a gouging feature and methods of forming the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present invention provides interconnect structures having improved EM resistance. The improved EM resistance is achieved in the present invention without the need of introducing a gouging feature within the interconnect structure. In particular, and in one embodiment, the improved EM resistance is provided by incorporating a metallic interfacial layer only on horizontal surfaces of a combined via and line opening formed within a dielectric material. In another embodiment, a metal alloy interfacial layer comprising a reaction product of a metallic interfacial layer and a conductive material is formed only within a bottom portion of the via.

Figure 1:
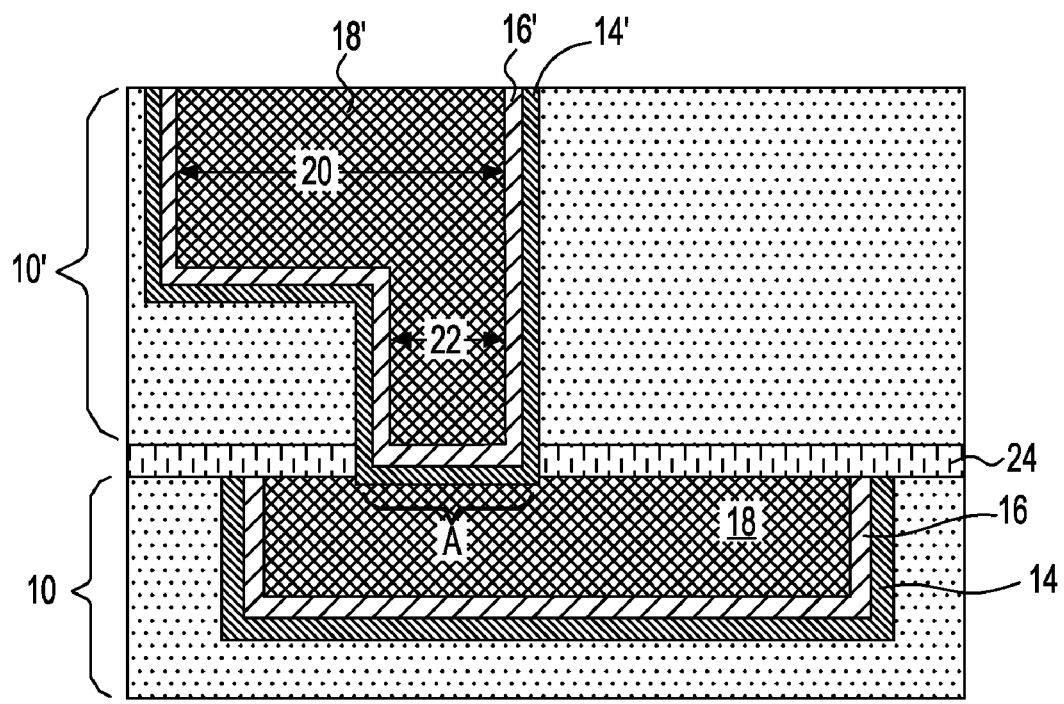
FIG. 1 is a pictorial representation (through a cross sectional view) depicting a prior art interconnect structure having a flat bottom via.
Figure 2:
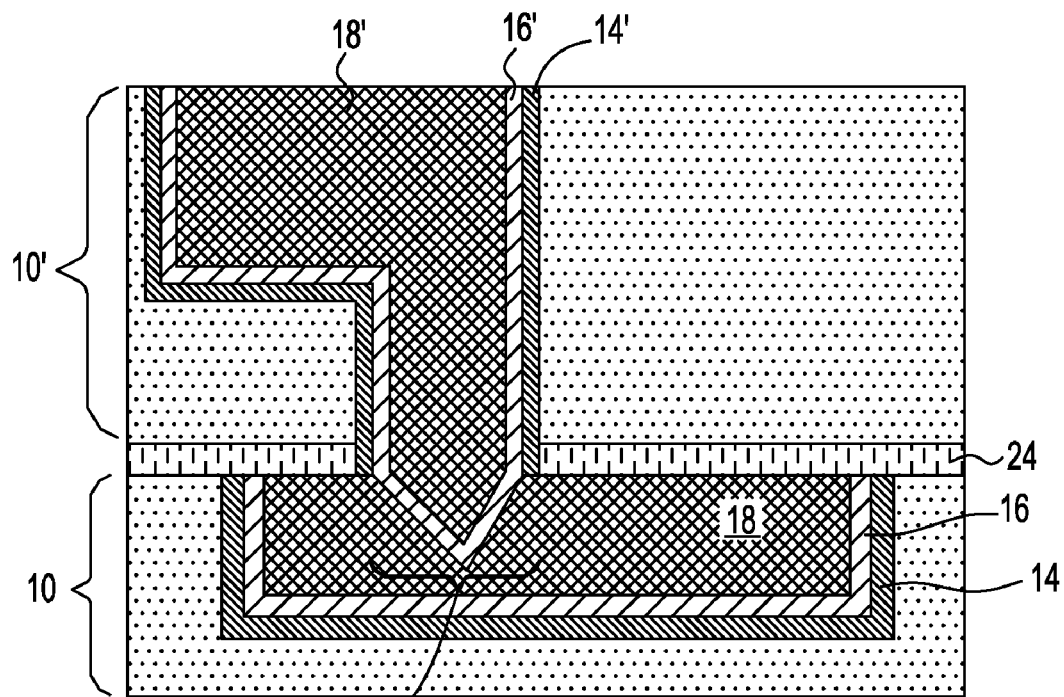
FIG. 2 is a pictorial representation (through a cross sectional view) depicting a prior art interconnect structure in which the via contact area has been increased by a gouging feature.
Figure 3A:
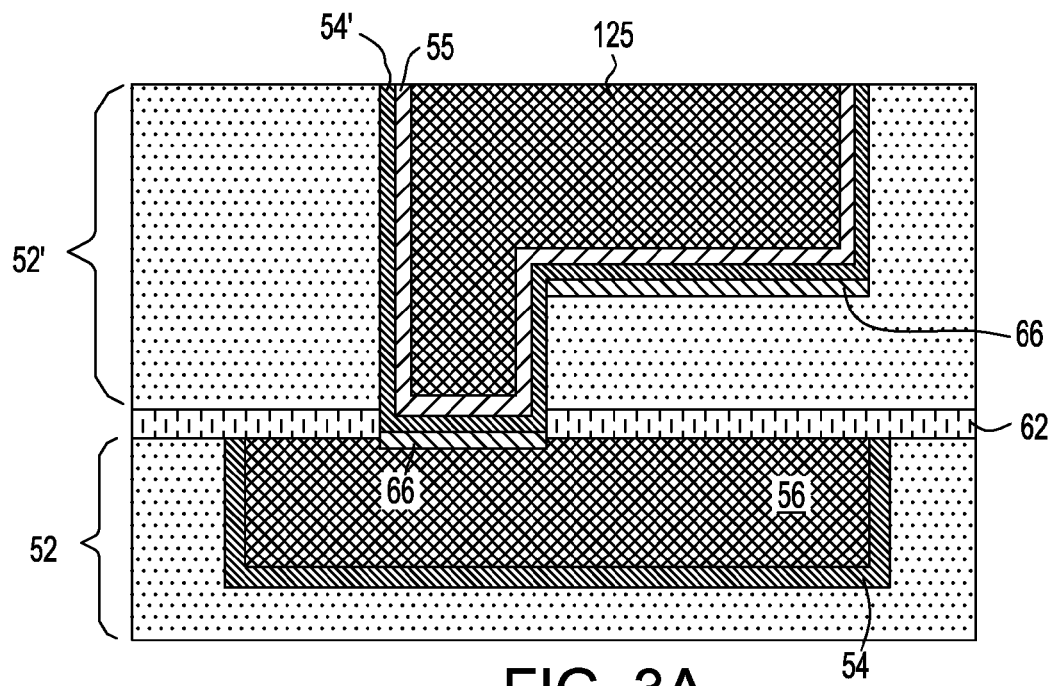
FIGS. 3A and 3B are pictorial representations (through cross sectional views) depicting interconnect structures of the present invention.
Figure 3B:
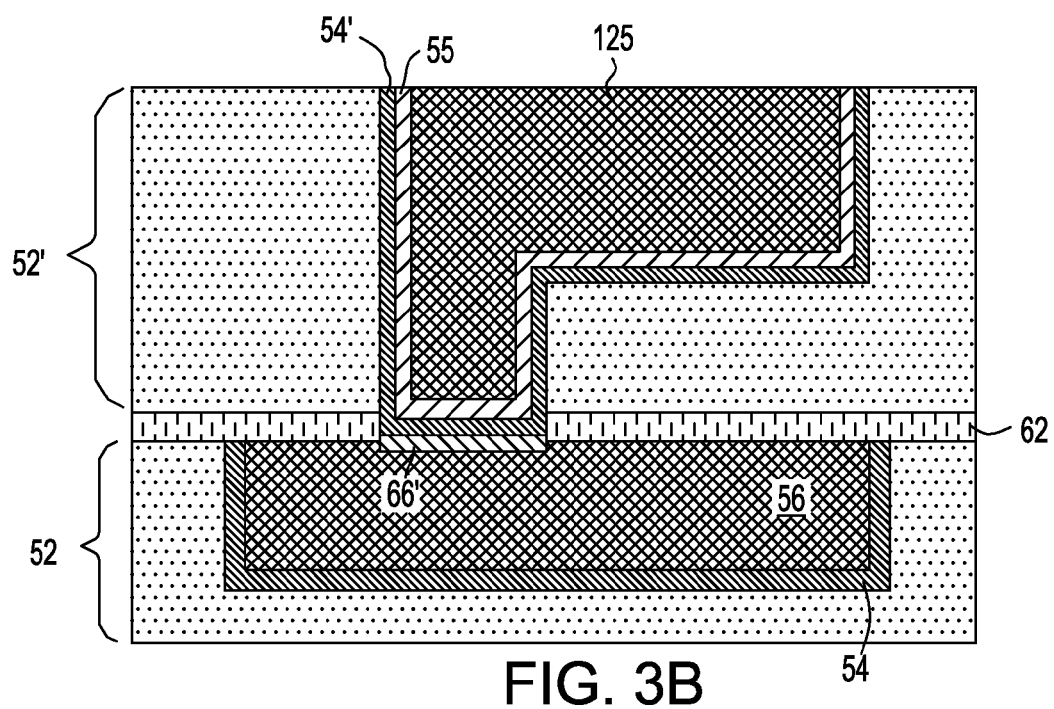

FIGS. 3A-3B illustrate these various embodiments of the present invention. Specifically, FIG. 3A illustrates an interconnect structure containing a metallic interfacial layer within the bottom portion of the opening and on the horizontal wall portion of the second dielectric material including the line pattern. In FIG. 3B, an interconnect structure is shown in which a metal alloy interfacial layer including the reaction product of a previously formed metallic interfacial layer and the underlying first conductive material is located only within the bottom portion of the via. It should be noted that the embodiment shown in FIG. 3A may include the metal alloy interfacial layer in place of all or part of the metallic interfacial layer. Also, the embodiment shown in FIG. 3B may include remaining metallic interfacial layer atop the metal alloy interfacial layer. The embodiments illustrated represent preferred embodiments of the invention.

In particular, the interconnect structures shown in FIGS. 3A and 3B both include a first dielectric material 52 having a first conductive material 56 embedded therein. The first conductive material 56 is spaced apart from the first dielectric material 52 by a first diffusion barrier liner 54. Each structure also includes a second dielectric material 52' located atop the first dielectric material 52. A dielectric capping layer 62 is typically located between the first dielectric material 52 and the second dielectric material 52'. As shown, portions of the dielectric capping layer 62 are located on the upper surface of the first conductive material 56.

The second dielectric material 52' includes at least one conductively filled opening 125 that is located above the first conductive material 56. The at least one conductive filled opening 125, which includes a combined via and line, extends to an upper surface of the first conductive material 56 present within the first dielectric material 52. In the embodiment illustrated in FIG. 3A, the bottom via portion of the at least one conductively filled opening 125 and the first conductive material 56 are horizontally separated by a metallic interfacial layer 66. That is, the metallic interfacial layer 66 is present at least within a bottom portion of the at least one conductively filled opening 125. In FIG. 3B, a metallic alloy interfacial layer 66' including the reaction product of a previously formed metallic interfacial layer and the underlying first conductive material 56 is located only within the bottom via portion of the conductively filled opening 125.

Each interconnect structure also includes a second diffusion barrier liner 54' that is located between said second dielectric material 52' and that at least one conductively filled opening 120. The second diffusion barrier liner 54' may include a lower layer of a metallic nitride such as, for example, TaN, and an upper layer of a metal such as, for example, Ta. An optional plating seed layer 55 may be present atop the second diffusion barrier liner 54'.

Reference is now made to FIGS. 4-7 which illustrate the basic processing steps that are employed in the present invention for fabricating the interconnect structure shown in FIG. 3A.

Figure 4:
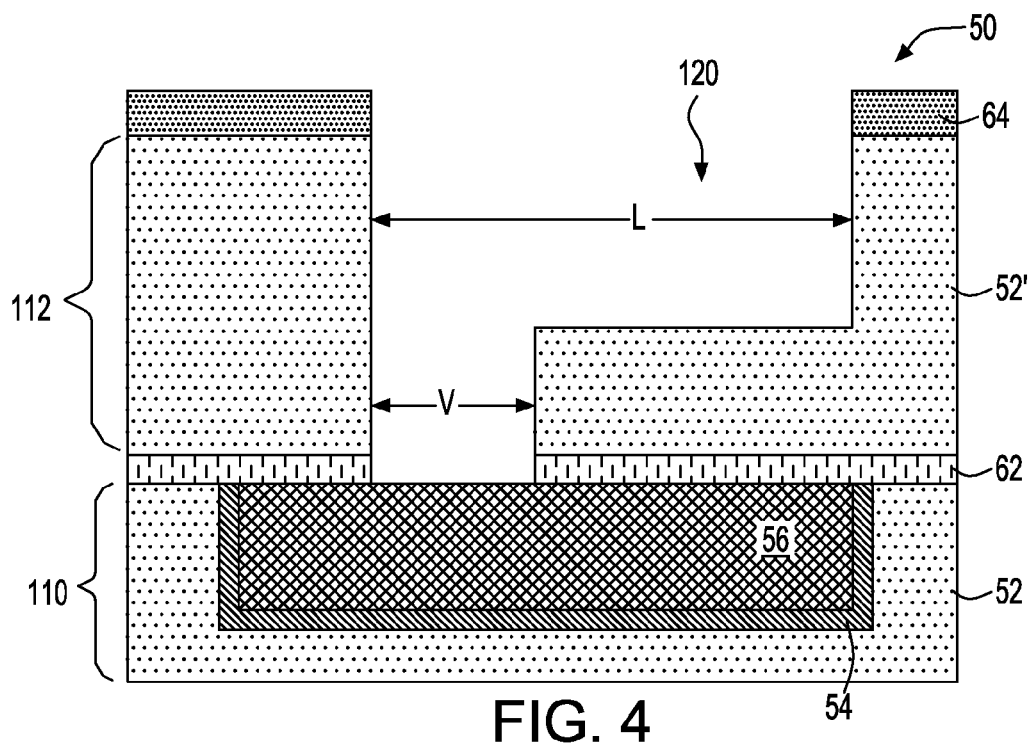
FIGS. 4-7 are pictorial representations (through cross sectional views) illustrating the basic processing steps that are employed in fabricating the inventive interconnect structure shown in FIG. 3A.

FIG. 4 illustrates an initial and partially formed interconnect structure 50 that is employed in the present invention. In particular, the initial and partially formed interconnect structure 50 is a multilevel interconnect structure including a lower interconnect level 110 and an upper interconnect level 112 that are separated in part by dielectric capping layer 62. The lower interconnect level 110, which may be located above a semiconductor substrate including one or more semiconductor devices, comprises a first dielectric material 52 having at least one conductive material (i.e., conductive feature or conductive region) 56 that is separated from the first dielectric material 52 by a first diffusion barrier liner 54. The upper interconnect level 112 comprises a second dielectric material 52' that has a combined via and line opening 120. In the drawing, the via is represented as V, and the line is represented as L.

The initial interconnect structure 50 shown in FIG. 4 is made utilizing standard interconnect processing which is well known in the art. For example, the initial interconnect structure 50 can be formed by first applying the first dielectric material 52 to a surface of a substrate (not shown). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

The first dielectric material 52 may comprise any interlevel or intralevel dielectric including inorganic dielectrics or organic dielectrics. The first dielectric material 52 may be porous or non-porous. Some examples of suitable dielectrics that can be used as the first dielectric material 52 include, but are not limited to $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first dielectric material 52 typically has a dielectric constant that is about 4.0 or less, with a dielectric constant of about 2.8 or less being even more typical. These dielectrics generally have a lower parasitic crosstalk as compared with dielectric materials that have a higher dielectric constant than 4.0. The thickness of the first dielectric material 52 may vary depending upon the dielectric material used as well as the exact number of dielectrics within the lower interconnect level 110. Typically, and for normal interconnect structures, the first dielectric material 52 has a thickness from about 200 to about 450 nm.

The lower interconnect level 110 also has at least one first conductive material 56 that is embedded in (i.e., located within) the first dielectric material 52. The first conductive material 56 (which may also be referred to as a conductive region or conductive feature) is separated from the first dielectric material 52 by a first diffusion barrier liner 54. The embedded first conductive material 56 is formed by first providing at least one opening into the first dielectric material 52 by lithography (i.e., applying a photoresist to the surface of the first dielectric material 52, exposing the photoresist to a desired pattern of radiation, and developing the exposed resist utilizing a conventional resist developer) and etching (dry etching or wet etching). The etched opening is first filled with the first diffusion barrier liner 54 and then with the first conductive material 56.

The first diffusion barrier liner 54, which may comprise Ta, TaN, Ti, TiN, Ru, RuTaN, RuTa, W, WN or any other material that can serve as a barrier to prevent conductive material from diffusing there through, is formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating. In some embodiments (not shown), the first diffusion barrier liner 54 may comprise a combination of layers including a lower layer of a metallic nitride and an upper layer of a metal.

The thickness of the first diffusion barrier liner 54 may vary depending on the exact means of the deposition process employed as well as the material and number of layers employed. Typically, the first diffusion barrier liner 54 has a thickness from about 4 to about 40 nm, with a thickness from about 7 to about 20 nm being more typical.

Following the formation of the first diffusion barrier liner 54, the remaining region of the opening within the first dielectric material 52 is filled with the first conductive material 56 forming a conductive feature. The first conductive material 56 used in forming the conductive feature includes, for example, polySi, a conductive metal, an alloy comprising at least one conductive metal, a conductive metal silicide or combinations thereof. Preferably, the first conductive material 56 that is used in forming the conductive feature is a conductive metal such as Cu, W or Al, with Cu or a Cu alloy (such as AlCu) being highly preferred in the present invention.

The conductive material is filled into the remaining opening in the first dielectric material 52 utilizing a conventional deposition process including, but not limited to CVD, PECVD, sputtering, chemical solution deposition or plating. After deposition, a conventional planarization process such as, for example, chemical mechanical polishing (CMP) can be used to provide a structure in which the first diffusion barrier liner 54 and the first conductive material 56 each have an upper surface that is substantially coplanar with the upper surface of the first dielectric material 52.

After forming the at least one conductive material 56, the dielectric capping layer 62 is formed on the surface of the lower interconnect level 110 utilizing a conventional deposition process such as, for example, CVD, PECVD, chemical solution deposition, or evaporation. The dielectric capping layer 62 comprises any suitable dielectric capping material such as, for example, SiC, $Si_4NH_3$, $SiO_2$, a carbon doped oxide, a nitrogen and hydrogen doped silicon carbide SiC(N, H) or multilayers thereof. The thickness of the dielectric capping layer 62 may vary depending on the technique used to form the same as well as the material make-up of the layer. Typically, the dielectric capping layer 62 has a thickness from about 15 to about 55 nm, with a thickness from about 25 to about 45 nm being more typical.

Next, the upper interconnect level 112 is formed by applying the second dielectric material 52' to the upper exposed surface of the dielectric capping layer 62. The second dielectric material 52' may comprise the same or different, preferably the same, dielectric material as that of the first dielectric material 52 of the lower interconnect level 110. The processing techniques and thickness ranges for the first dielectric material 52 are also applicable here for the second dielectric material 52'.

A hard mask 64 is then formed atop the second dielectric material 52' and is subsequently used as both a pattern mask and as an etch mask. The hard mask 64 includes at least one dielectric material such as, for example, an oxide, nitride or an oxynitride. The hard mask 64 typically comprises an oxide of silicon or a nitride of silicon. The hard mask 64 is formed utilizing a conventional deposition process including, for example, CVD, PECVD, chemical solution deposition, evaporation and atomic layer deposition.

Next, a combined via and line opening 120 is formed into the second dielectric material 52' utilizing a conventional dual damascene process which includes lithography and etching; the etching step also opens, e.g., patterns, the dielectric capping layer 62. It is noted that although a single combined via and line opening is illustrated, the present invention contemplates embodiments wherein a plurality of combined via and line openings are formed. The etching may comprise a dry etching process, a wet chemical etching process or a combination thereof. The term "dry etching" is used herein to denote an etching technique such as reactive-ion etching, ion beam etching, plasma etching or laser ablation.

The combined via and line opening 120 includes a lower via V that extends to and exposes a surface of the first conductive material 56 within the first dielectric material 52 and an upper line L that is in contact with the lower via. As shown, the via has a width that is less than the width of the line. During the etching process, the pattern is first transferred into the hard mask 64, the photoresist is then removed by a conventional stripping process such as ashing, and thereafter the pattern is transferred to the second dielectric material 52' and then to the dielectric capping layer 62 (i.e., the dielectric capping layer is opened exposing a surface of the first conductive material 56). In a dual damascene process, the via is typically formed first followed by the line. In some embodiments, the line may be formed first and then the via. Typically, the dual damascene includes two patterning and two etching steps.

Figure 5:
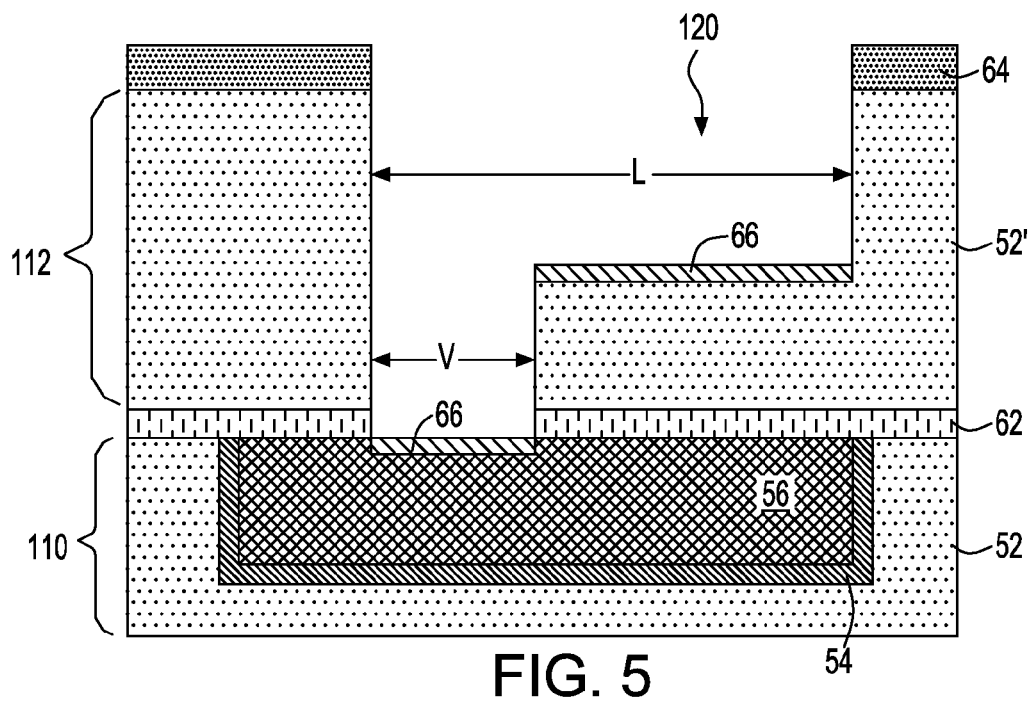

FIG. 5 illustrates the interconnect structure of FIG. 4 after formation of a metallic interfacial layer 66 only on horizontal surfaces within the combined via and line opening 120, i.e., atop the exposed surface of the first conductive material 56 at the bottom of the via and on the exposed horizontal surface of the second dielectric material 52' within the line.

The metallic interfacial layer 66 employed in the present invention includes any conductive metal including metals from Group VB or VIII of the Periodic Table of Elements. Examples of Group VB metals that are conductive include V, Nb and Ta. Examples of Group VIII metals that are conductive include Fe, Co, Ni, Ru, Rh, Pd, Os, Ir and Pt. In a preferred embodiment of the present invention, the metallic interfacial layer 66 comprises Ta, Ru, Ir or Co. In some embodiments of the present invention, the metallic interfacial layer 66 comprises In.

In the specific embodiment illustrated, the metallic interfacial layer 66 is formed utilizing a metal infusion process such as, for example, a gas cluster ion beam process. Alternatively, the metallic interfacial layer 66 is formed by physical vapor deposition (PVD) or another like deposition process that is capable of depositing a metal on horizontal surfaces only.

The thickness of the metallic interfacial layer 66 that is formed may vary depending of the type of selective deposition process employed as well as the material of the metallic interfacial layer 66 itself. Typically, the metallic interfacial layer 66 has a thickness from about 1 to about 20 nm, with a thickness from about 5 to about 10 nm being even more typical.

In some embodiments of the invention, an annealing step may now be performed which is capable of reacting the metallic interfacial layer 66 within the via with the underlying first conductive material 56 to form a metal alloy interfacial layer comprising the reaction product of the metallic interfacial layer 66 and the first conductive material 56. The formation of the metal alloy interfacial layer is not shown in the drawings of this embodiment of the invention. If shown, the metal alloy interfacial layer that is formed would be present in the bottom portion of the via replacing all or a part of the metallic interfacial layer 66. In some embodiments, the metal alloy interfacial layer would be formed between a remaining portion the metallic interfacial layer 66 and the underlying remaining first conductive material 56.

When employed, the annealing is performed utilizing a thermal annealing process including, for example, a furnace anneal, a spike anneal, a rapid thermal anneal or a laser anneal. The temperature of the annealing process that may be used in the present invention may vary so long as it is capable of causing the above described reaction between the metallic interfacial layer 66 and the first conductive material 56. Typically, the temperature of the anneal is from about 200° to about 500° C., with a temperature from about 300° to about 400° C. The duration of the annealing may vary depending on the type of annealing process performed. Typically, the duration of the annealing is from about 30 seconds to about 120 minutes, with a duration from about 120 seconds to about 60 minutes even more typical.

The annealing may be performed in an inert ambient including, for example, helium, argon, neon, krypton, xenon, nitrogen and mixtures thereof. In some embodiments, the annealing is performed in a mixture of nitrogen and hydrogen in which the hydrogen content is less than 10%.

Figure 6:
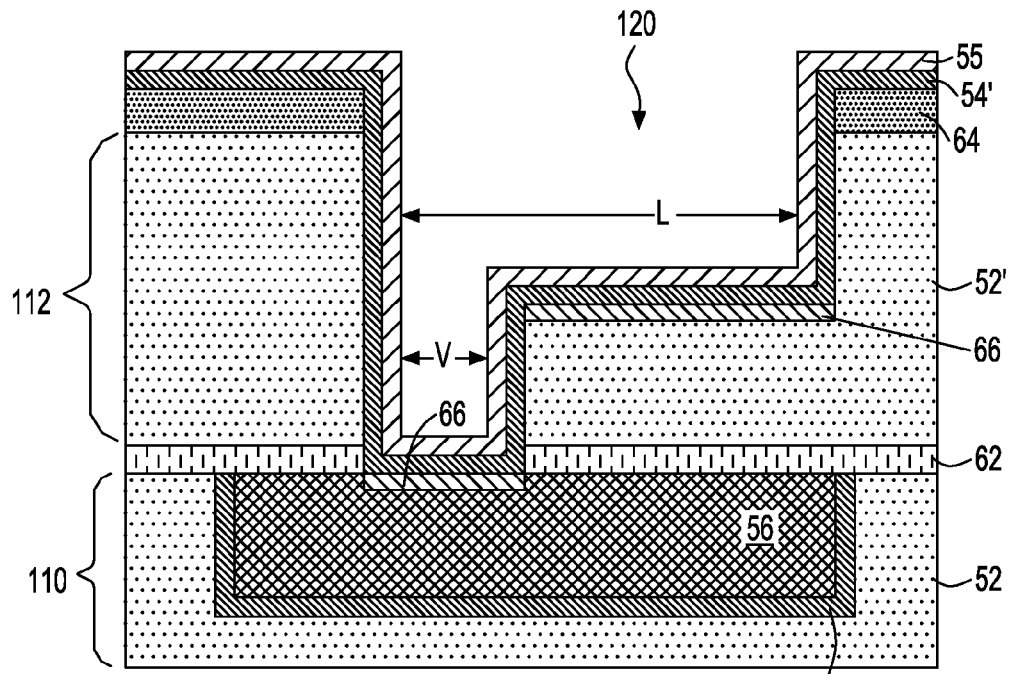

FIG. 6 shows the interconnect structure of FIG. 5 after formation of a second diffusion barrier liner 54'. The second diffusion barrier liner 54' may include a lower layer of a metallic nitride (e.g., TaN, TiN, RuTaN or WN) and an upper layer of a metal (e.g., Ta, Ti, Ru, RuTa or W). Alternatively, the second diffusion barrier liner 54' may include a single layer instead of a bilayer. In FIG. 6, the second diffusion barrier liner 54' is meant to include both embodiments discussed above. The second diffusion barrier liner 54' is formed utilizing one of the above mentioned techniques used in forming the first diffusion barrier liner 54 and the same diffusion barrier materials can be present within the second diffusion barrier liner 54' as the first diffusion barrier liner 54. It is also noted that the thickness of the second diffusion barrier liner 54' is also within the thickness range reported above for the first diffusion barrier liner 54. It is noted that the second diffusion barrier liner 54' is located atop the upper surface of the patterned hard mask 64.

In some embodiments of the present, an optional plating seed layer can be formed on the upper exposed surface of the second diffusion barrier 54'. In FIG. 6, reference numeral 55 denotes a plating seed layer that can be employed in the present invention. The plating seed layer 55 that may be employed includes a metal or metal alloy from Group VIII of the Periodic Table of Elements. Alternatively, Cu can be used as the plating seed layer 55. Examples of suitable Group VIII elements for the plating seed layer include, but are not limited to Ru, TaRu, Ir, Rh, Pt, Pd and alloys thereof. In some embodiments, it is preferred to use Cu, Ru, Ir or Rh as the plating seed layer 55.

The plating seed layer 55 is formed by a conventional deposition process including, for example, chemical vapor deposition (CVD), plasma enhanced chemical vapor deposition (PECVD), atomic layer deposition (ALD), plating, sputtering and physical vapor deposition (PVD). The thickness of the plating seed layer 55 may vary depending on number of factors including, for example, the compositional material of the plating seed layer 55 and the technique that was used in forming the same. Typically, the plating seed layer 55 has a thickness from about 0.5 to about 10 nm, with a thickness of less than 6 nm being even more typical.

Figure 7:
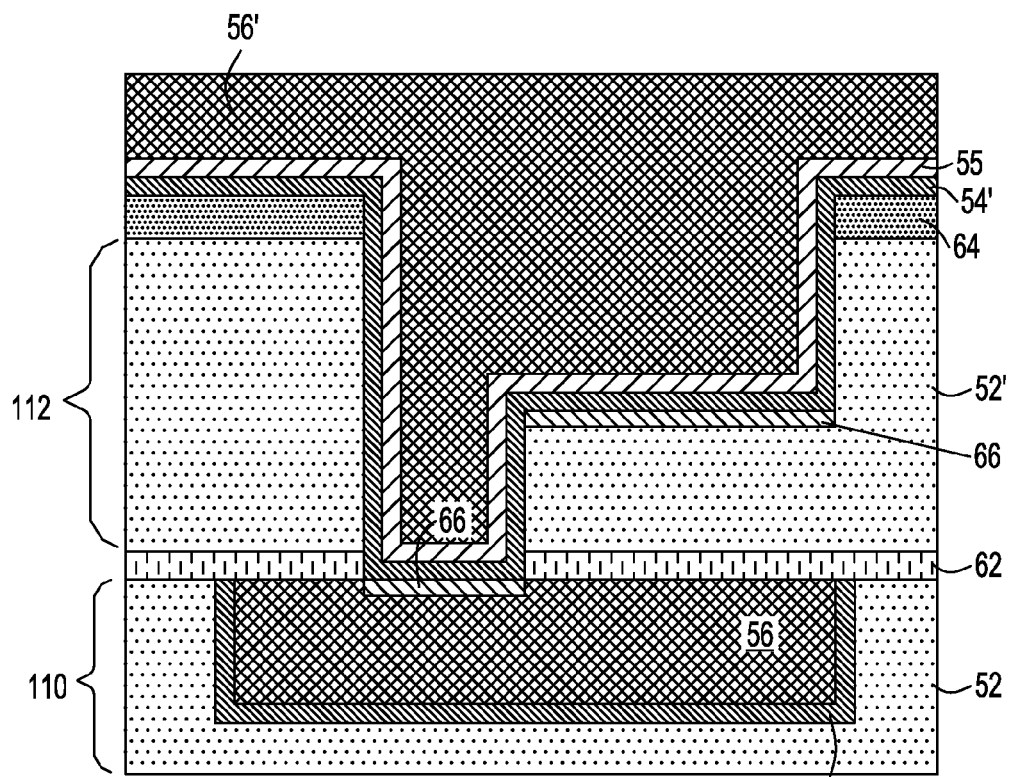

FIG. 7 illustrates the interconnect structure of FIG. 6 after filling the combined via and line opening 120 with a second conductive material 56'; note that the second conductive material 56' is formed either atop the second diffusion barrier liner 54', if the plating seed layer is not present, or atop the plating seed layer. The second conductive material 56' may comprise the same or different conductive material as the first conductive material 56. Preferably, the first conductive material 56 and the second conductive material 56' are comprised of a Cu-containing conductive material. As is shown, the filling step also forms the second conductive material 56' outside each of the openings present in the second dielectric material 52.

Next, a planarization process including chemical mechanical polishing and/or grinding, is employed to provide the planar structure shown in FIG. 3A. During the planarization process, the hard mask 64 is typically removed from the structure.

Additional interconnect levels can be formed atop the interconnect structure shown in FIG. 3A utilizing the processes steps described above to form a multilayered interconnect structure including the inventive metallic interfacial layer between each of the conductive features embedded within the multilayered interconnect structure.

Figure 8:
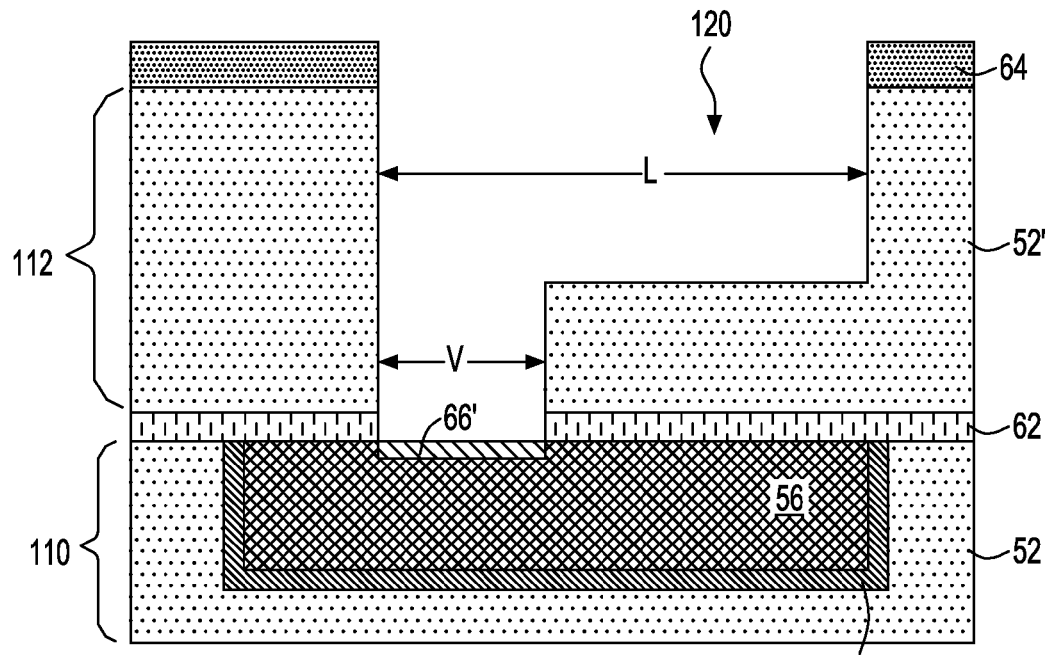
FIGS. 8-10 are pictorial representations (through cross sectional views) illustrating the basic processing steps that are employed in fabricating the inventive interconnect structure shown in FIG. 3B.
Figure 9:
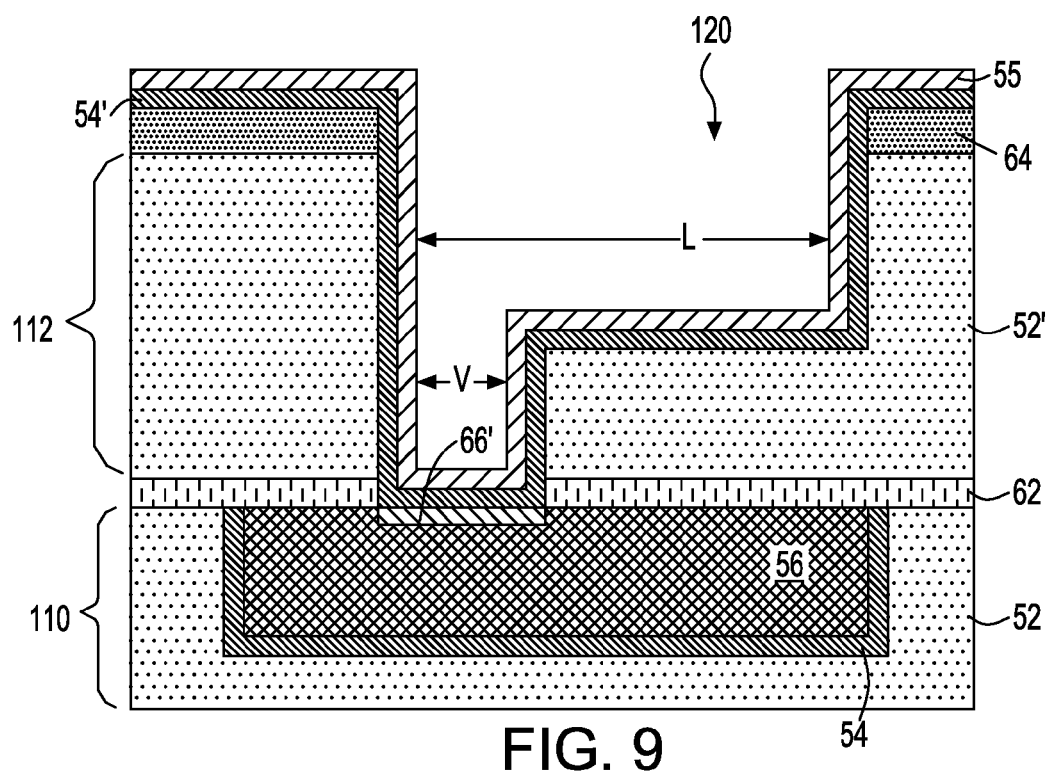
Figure 10:
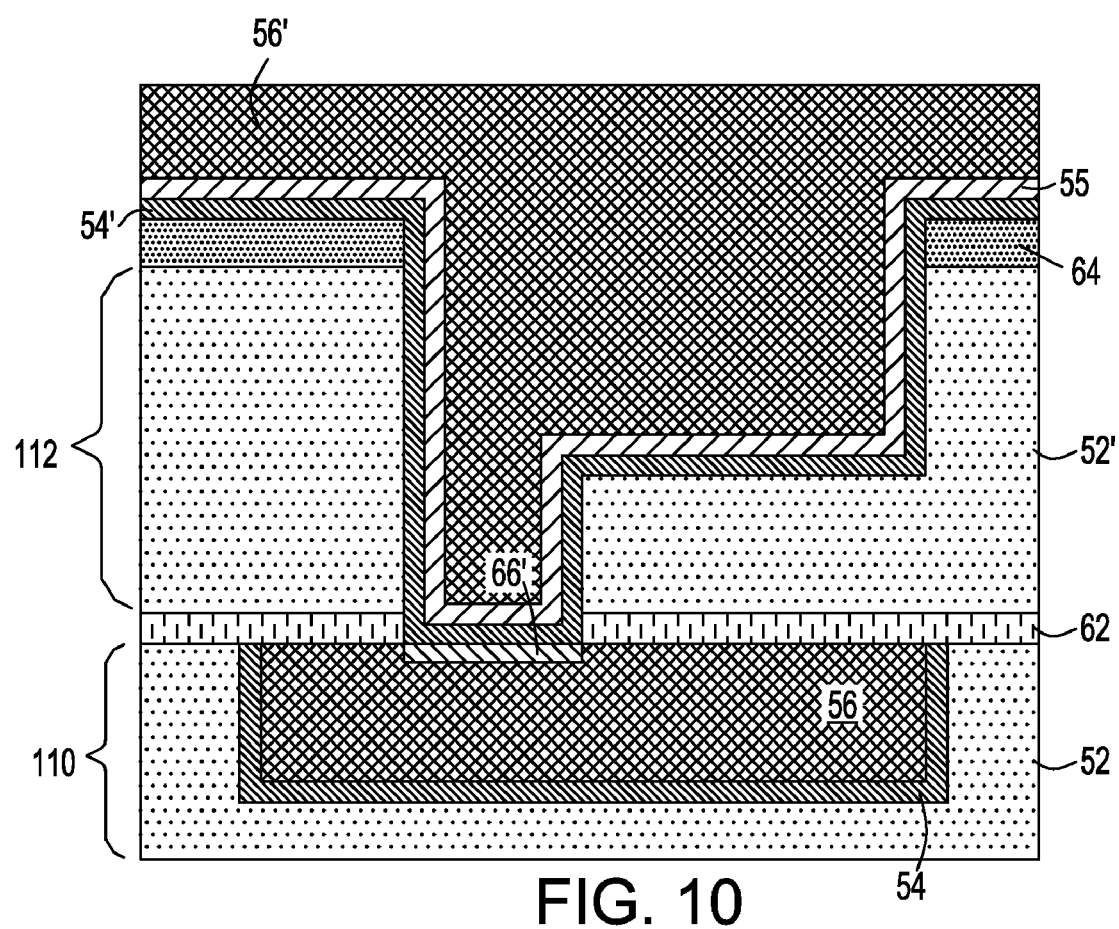

FIGS. 8-10 illustrate a second embodiment of the present invention which provides the structure shown in FIG. 3B. In the second embodiment, the initial and partially formed interconnect structure 50 is first provided as described above and as is shown in FIG. 4. After providing the structure shown in FIG. 4, a metallic interfacial layer is formed only on the exposed horizontal surface of the underlying first conductive material 56. As such, the metallic interfacial layer is self-aligned to the exposed upper portion of the first conductive material 56. The metallic interfacial layer is comprised of one of the materials described above in the first embodiment of the invention. Unlike the first embodiment described above in which the metallic interfacial layer was also formed on the exposed horizontal portion of the line formed into the second dielectric material 52', in the second embodiment of the invention the metallic interfacial layer is only formed on the exposed surface of the underlying first conductive material 56.

In this embodiment of the present invention, a self-aligned deposition process such as, for example, chemical vapor deposition, plasma enhanced chemical vapor deposition, plating and atomic layer deposition, is employed in forming the metallic interfacial layer. The thickness of the self-aligned metallic interfacial layer is the same as that described above in the first embodiment of the invention.

An annealing step is now performed which is capable of reacting the metallic interfacial layer within the bottom portion of the via with the underlying first conductive material 56 to form a metallic alloy interfacial layer comprising a reaction product of the metallic interfacial layer and the first conductive material. The formation of metal alloy interfacial layer 66' is shown in FIG. 8 of the present invention. The metal alloy interfacial layer 66' is formed in the via bottom replacing all or a part of metallic interfacial layer; in the drawing provided the metal alloy interfacial layer 66' replaces all of the metallic interfacial layer. In some embodiments (not shown), the metal alloy interfacial layer 66' would be formed between a remaining portion the metallic interfacial layer and the underlying remaining first conductive material.

The annealing is performed utilizing the annealing techniques and conditions described above in the first embodiment of the invention.

FIG. 9 illustrates the structure of FIG. 8 after forming a second diffusion barrier liner 54' and an overlying plating seed layer 55 thereon. The composition and thickness of second diffusion barrier liner 54' as well as the process used in forming the same are as described above in the first embodiment. Additionally, the composition and thickness of the plating seed layer 55 as well as the process used in forming the same are as described above in the first embodiment.

FIG. 10 illustrates the structure of FIG. 9 after filling the opening with a second conductive material 56'. The composition and thickness of second conductive material diffusion barrier liner 56' as well as the process used in forming the same are as described above in the first embodiment. After providing the structure shown in FIG. 10, a planarization process is employed to provide the interconnect structure shown in FIG. 3B.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming an interconnect structure comprising:

providing a structure including a first dielectric material having a first conductive material embedded therein and a second dielectric material located above said first dielectric material, said second dielectric material having a combined via and line opening which exposes a surface of said first conductive material and a bare horizontal surface of said second dielectric material in a line opening portion of said combined via and line opening, wherein said second dielectric material includes a patterned hard mask located on an upper surface thereof;

forming a metallic interfacial layer only on said exposed surface of said first conductive material, and along a horizontal wall portion of said line opening portion and in direct contact with said bare horizontal surface of said second dielectric material in said line opening portion, wherein said patterned hard mask protects the upper surface of the second dielectric so that said metallic interfacial layer does not form thereon and wherein said forming said metallic interfacial layer consists essentially of selecting a metal from the group consisting of V, Nb, Ta, Fe, Co, Ni, Ru, Rh, Pd, Os, Ir, Pt and In and depositing said metal;

forming a diffusion barrier liner within said combined via and line opening and atop the patterned hard mask, wherein a portion of said diffusion barrier liner is located atop said metallic interfacial layer containing said metal;

forming a second conductive material on said diffusion barrier liner; and performing a planarization step, wherein said planarization step removes portions of the second conductive material, said diffusion barrier liner and said patterned hard mask forming a structure in which said second conductive material has an upper surface that is coplanar with the upper surface of said second dielectric.

2. The method of claim 1 wherein said depositing comprises a metal infusion process or physical vapor deposition.

3. The method of claim 2 wherein said metal infusion process comprises a gas cluster ion beam process.

4. The method of claim 1 further comprising forming a plating seed layer between said forming the diffusion barrier liner and forming the second conductive metal.

5. The method of claim 1 wherein an uppermost surface of said metallic interfacial layer located atop the first conductive material extends above an uppermost surface of said first dielectric material.

6. A method of forming an interconnect structure comprising:
providing a structure including a first dielectric material having a first conductive material embedded therein and a second dielectric material located above said first dielectric material, said second dielectric material having a combined via and line opening which exposes a surface of said first conductive material and a bare horizontal surface of said second dielectric material in a line opening portion of said combined via and line opening, wherein said second dielectric material includes a patterned hard mask located on an upper surface thereof;
forming a metallic interfacial layer only on said exposed surface of said first conductive material, but not on said bare horizontal surface of said second dielectric material in said line opening portion, wherein said patterned hard mask protects the upper surface of the second dielectric so that said metallic interfacial layer does not form thereon;
converting at least a portion of said metallic interfacial layer on said exposed surface of said first conductive material into a metal alloy interfacial layer, said converting includes annealing, wherein after annealing a remaining portion of said metallic interfacial layer remains atop and completely covers said metal alloy interfacial layer, and said metal alloy interfacial layer is present entirely on said exposed surface of said first conductive material;
forming a diffusion barrier liner within said combined via and line opening and atop the patterned hard mask, wherein a portion of said diffusion barrier liner in said line opening portion is in direct contact with said bare horizontal surface of said second dielectric material and another portion of said diffusion barrier liner is located atop said remaining portion of said metallic interfacial layer;
forming a second conductive material on said diffusion barrier liner; and
performing a planarization step, wherein said planarization step removes portions of the second conductive material, said diffusion barrier liner and said patterned hard mask forming a structure in which said second conductive material has an upper surface that is coplanar with the upper surface of said second dielectric.

7. The method of claim 6 wherein said annealing is performed at a temperature from about 200° to about 500° C.

8. The method of claim 6 wherein said forming said metallic interfacial layer comprises a self-aligned deposition process selected from chemical vapor deposition, physical enhanced chemical vapor deposition, plating and atomic layer deposition.

9. The method of claim 6 wherein said metallic interfacial layer is a metal selected from V, Nb, Ta, In, Fe, Ru, Rh, Os, Ir and Pt.

10. The method of claim 6 wherein said metallic interfacial layer is a metal selected from V, Nb, Ta, and In.

11. The method of claim 6 wherein said forming the metallic interfacial layer comprises a gas cluster ion beam process.

12. The method of claim 6 wherein said annealing is performed in a mixture of nitrogen and hydrogen, wherein said hydrogen is present in a content of less than 10%.

13. The method of claim 6 further comprising forming a plating seed layer between said forming the diffusion barrier liner and forming the second conductive metal.

14. The method of claim 6 wherein an uppermost surface of said remaining metallic interfacial layer located atop the metal alloy interfacial layer extends above an uppermost surface of said first dielectric material.

15. A method of forming an interconnect structure comprising:
providing a structure including a first dielectric material having a first conductive material embedded therein and a second dielectric material located above said first dielectric material, said second dielectric material having a combined via and line opening which exposes a surface of said first conductive material and a bare horizontal surface of said second dielectric material in a line opening portion of said combined via and line opening, wherein said second dielectric material includes a patterned hard mask located on an upper surface thereof;
forming a metallic interfacial layer only on said exposed surface of said first conductive material, and said bare horizontal surface of said second dielectric material in said line opening portion, wherein said patterned hard mask protects the upper surface of the second dielectric so that said metallic interfacial layer does not form thereon;
converting at least a portion of said metallic interfacial layer that is located atop said first conductive material into a metal alloy interfacial layer, said converting includes annealing, wherein after annealing a remaining portion of said metallic interfacial layer remains atop and completely covers said metal alloy interfacial layer that is located atop said first conductor material, and said metal alloy interfacial layer is present entirely on said exposed surface of said first conductive material;
forming a diffusion barrier liner within said combined via and line opening and atop the patterned hard mask, wherein a portion of said diffusion barrier liner in said line opening portion is in direct contact with said metallic interfacial layer present on said bare horizontal surface of said second dielectric material and another portion of said diffusion barrier liner in located atop said remaining portion of said metallic interfacial layer;
forming a second conductive material on said diffusion barrier liner; and
performing a planarization step, wherein said planarization step removes portions of the second conductive material, said diffusion barrier liner and said patterned hard mask forming a structure in which said second conductive material has an upper surface that is coplanar with the upper surface of said second dielectric.

16. The method of claim 15 wherein an uppermost surface of said metallic interfacial layer located atop the metal alloy interfacial layer extends above an uppermost surface of said first dielectric material.

* * * * *